United States Patent [19]

Cooper et al.

[11] Patent Number: 5,006,442
[45] Date of Patent: Apr. 9, 1991

[54] METHOD OF FORMING A DISCONTINUOUS COVERING LAYER ON RADIATION SENSITIVE DEVICES

[75] Inventors: Graham P. Cooper, Bramley; Reginald T. Jones, Chandlers Ford, both of United Kingdom

[73] Assignee: Vickers PLC, London, United Kingdom

[21] Appl. No.: 359,373

[22] Filed: May 31, 1989

[30] Foreign Application Priority Data

Jun. 3, 1988 [GB] United Kingdom ............... 8813154

[51] Int. Cl.$^5$ .................... G03C 1/495; G03C 1/76; G03C 1/52
[52] U.S. Cl. .................................. 430/168; 430/156; 430/166; 430/192; 430/271; 430/273; 430/935; 430/950
[58] Field of Search ............... 430/273, 271, 168, 935, 430/950, 166, 192, 961

[56] References Cited

U.S. PATENT DOCUMENTS 4,842,982 6/1989 Seibel et al. .................. 430/273

Primary Examiner—Charles L. Bowers, Jr.
Assistant Examiner—John S. Y. Chu
Attorney, Agent, or Firm—Harness, Dickey & Pierce

[57] ABSTRACT

A radiation sensitive plate is provided with a discontinuous covering layer to improve vacuum drawdown. The covering layer is produced by dissolving the material which is to form the covering layer in a solvent so as to form a solution having a conductivity of from $10^3$ to $10^9$ pSm$^{-1}$. The solution is then directed towards the plate whilest providing a potential of at least 5 kV between the solution and the plate. The potential is the sole disruptive force in the liquid and draws the liquid into ligaments and disrupts the ligaments to form drops of substantially equal size which are then deposited on the plate.

8 Claims, 3 Drawing Sheets

METHOD OF FORMING A DISCONTINUOUS COVERING LAYER ON RADIATION SENSITIVE DEVICES

This invention relates to radiation sensitive devices and more particularly, but not exclusively, is concerned with radiation sensitive plates for the production of lithographic printing plates.

Such radiation sensitive devices are known and comprise a substrate, e.g. a metallic sheet, coated with a radiation sensitive layer. In use of such devices in lithographic printing plate production, the radiation sensitive layer is exposed to radiation using a transparency so that parts of the layer are struck by the radiation and other parts are not. In the case of negative-working radiation sensitive layers, the radiation struck areas become less soluble than the non-radiation struck areas. In the case of positive-working radiation sensitive layers, the radiation struck areas become more soluble than the non-radiation struck areas. Thus, by treating the image-wise exposed layer with a developer liquid for the more soluble areas, these areas can be selectively removed from the substrate to form an image constituted by the less soluble areas. This image constitutes the printing image of the eventual printing plate and the non-printing areas of the plate are constituted by the surface of the substrate revealed on development.

The printing image and the non-printing areas are essentially co-planar and the lithographic printing process depends upon the differing affinities of the printing image and the non-printing areas for ink and water. The printing image is ink-receptive and water-repellant and the non-printing areas are water-receptive and ink-repellant. During printing, water is applied to the plate and is received by the non-printing areas and repelled by the printing image. Then, ink is applied and this is repelled by the wet non-printing areas and received by the printing image. The ink is then transferred from the printing image onto the paper or the like to be printed.

When image-wise exposing a radiation-sensitive plate in the production of a lithographic printing plate it is essential that there is good contact between the transparency through which the plate is to be exposed and the radiation sensitive layer of the plate itself. The contact is achieved by using a printing down frame in which the plate and transparency are positioned between a flexible backing member and a glass sheet. The air between the backing member and the glass sheet is evacuated causing the plate and transparency to be squeezed together. The process is conventionally referred to as vacuum drawdown.

However, it is possible for pockets of air to be trapped between the smooth surface of the radiation sensitive layer of the plate and the transparency preventing, or at least extending the time required to achieve, the necessary contact. To overcome this problem, the radiation sensitive layer may be given a roughened surface which provides channels through which such air pockets can be evacuated.

There have been many suggestions as to how the roughened surface may be provided and in this regard reference may be made to UK Patent Specification No. 1495361, No. 1512080, No. 2046461, and No. 2075702 and European Patent Specification No. 21428.

Japanese Patent Specification No. 98505/76 discloses spraying a waxy or fine-powdered resin from a solvent liquid onto the surface of the radiation sensitive layer so as to leave sprayed particles on the surface.

UK Patent Specification No. 2043285 discloses spraying the radiation sensitive layer with a powder and UK Patent Specification No. 2081919 discloses spraying the radiation sensitive layer with a water-soluble resin from an aqueous solution.

Whilst these suggestions all improve the vacuum drawdown they have certain disadvantages such as lack of adhesion of the sprayed particles to the radiation sensitive layer or incompatibility of the sprayed material with the radiation sensitive layer, or with the developer liquids commonly used to develop the radiation sensitive layer after image-wise exposure.

To overcome these disadvantages, European Patent Specification No. 174588 discloses providing the surface of the radiation sensitive layer with a covering layer having the same composition as the radiation sensitive layer by spraying the radiation sensitive layer with a solution containing the same components as the radiation sensitive layer. Whilst this approach gives an improvement it still has certain disadvantages which are detailed in WO 87/03706 wherein the radiation sensitive layer is sprayed with a discontinuous covering layer which is more light sensitive than the radiation sensitive layer.

However, whatever the nature of the covering layer there is an inherent problem when conventional spraying techniques are used to apply a discontinuous layer. In conventional spraying techniques, the liquid to be sprayed is disrupted into drops (atomised) by means of mechanical forces. These can be turbulent air, mechanical shear (rotating disc/bell) or expansion of the fluid as it is pumped at high pressure through a small orifice (airless spraying). Conventional electrostatic spraying also uses one of these methods to atomise the liquid to be sprayed, the atomised droplets thus produced then being electrostatically charged to attract them to the grounded workpiece to be sprayed in order to improve deposition efficiency. The problem with these mechanical methods of atomising is that the spray drops thus produced vary widely in size. For example in an air atomised spray mist, the drop diameters have been measured and found to vary from 5 microns up to 100 microns.

The evaporation rate of the solvent from an airborne drop is dependent on the ratio of the surface area to the volume and therefore the drop size. If the diameter (assuming a spherical drop) is doubled, this ratio decreases by 50%. Thus the solvent in a drop having a diameter of 10 microns will evaporate at half the rate of a drop having a diameter of 5 microns and eight times the rate of a drop having a diameter of 80 microns. Thus in a typical spray mist there are enormous differences between the time taken to evaporate the solvent from the smallest drops and the time taken to evaporate the solvent from the largest drops.

The evaporation of the solvent is, of course, also dependent on the ambient temperature and the transit time of the drop. If these parameters are chosen so that the small drops are still sufficiently wet when they reach the surface of the device to adhere thereto, the large drops will be extremely wet. If, on the other hand, conditions are chosen so that the larger particles are just sufficiently wet to adhere to the surface, the small drops will have dried completely and will not adhere to the surface at all.

Each of these situations produces a problem. If the spraying conditions are such that the larger drops are too wet and the solvent used is also a solvent for the radiation sensitive layer, the drop could penetrate the coating. Although this problem could be overcome by using a solvent which does not dissolve the radiation sensitive layer, this produces a further problem by restricting the compatibility of the dissolved material in the drop with the material in the layer and therefore with the developer liquid for the layer.

If the spraying conditions are such that the smaller drops are completely dry, then a dust handling problem is produced and under certain conditions this dust could be an explosion hazard.

According to the present invention, there is provided a method of producing a radiation sensitive device which comprises (i) providing a substrate carrying a radiation sensitive layer and (ii) applying to the surface of the radiation sensitive layer a discontinuous covering layer by dissolving the material which is to form the discontinuous layer in a solvent to produce a liquid having a conductivity of from $10^3$ to $10^9$ pSm$^{-1}$ (preferably $10^3$ to $10^8$ pSm$^{-1}$) and directing said liquid towards the radiation sensitive layer whilst applying directly or inducing indirectly in said liquid a potential of at least 5 kV of either polarity relative to the substrate so that the liquid forms drops in the absence of any other disruptive forces acting on the liquid, which drops are then deposited on the radiation sensitive layer.

In use of the method, the liquid is drawn out into one or more ligaments which break up into substantially equal sized drops which are attracted to the surface of the radiation sensitive layer due to the potential difference. Because the drops are of substantially the same size, the evaporation of the solvent can be controlled so that all the drops reach the surface of the radiation sensitive layer at a similar degree of wetness.

According to a preferred embodiment of the invention, the potential applied or induced is from 5 (preferably 10) to 35 kV of either polarity relative to the substrate. Too low a potential for a given liquid feed rate can give insufficient force to properly atomise the liquid giving a wide variety of drop sizes. Too high a potential can cause corona discharge from the tips of the ligaments which also gives a wide variety of drop sizes. Typically, the liquid feed rate may be from 0.05 to 2.0 cc per min per ligament.

The size of the drops produced can be varied by adjusting the parameters: liquid feed rate, liquid conductivity or potential applied. Reducing the liquid flow, increasing the liquid conductivity or increasing the potential applied all reduce the drop size. Larger changes in drop size can be achieved by varying two or more of the parameters simultaneously.

The discontinuous covering layer may or may not be formed of radiation sensitive material. In the former case, liquid used to form the layer may be an organic solvent solution of, for example, a quinone diazide such as a naphthoquinone diazide ester or a negative working diazo resin as described in our European Patent No. 0 030 862. In the latter case, the liquid may be an organic solvent solution of a resin such as a vinyl acetate vinyl versatate half ester maleate.

The radiation sensitive layer on which the discontinuous covering layer is formed may be a positive-working material such as a composition comprising a novolak resin and a naphthoquinone diazide ester or a negative-working material such as a composition as described in our European Patent No. 0 030 862.

For a better understanding of the invention and to show how the same may be carried out reference will now be made, by way of example to the accompanying drawings, in which:

BRIEF DESCRIPTION OF THE DRAWINGS

In the drawings, corresponding parts are denoted by like reference numerals.

Referring now to FIG. 1, the apparatus comprises a spray head 1 including a first inlet 2 for liquid to be sprayed and a second inlet 3 for compressed air. The inlets 2 and 3 communicate with conduits 4 and 5 respectively which terminate in concentrically arranged outlets 6 and 7 respectively. The head includes a charging needle 8 connected to a high tension source.

In use, liquid and compressed air are fed into the head via inlets 2 and 3 and emerge via outlets 6 and 7. The compressed air causes the formation of a turbulent air zone in the vicinity of the outlets 6 and 7 resulting in disruption of the liquid to form droplets. An electrostatic charge is induced in the liquid drops by the needle 8 and the drops are then attracted to the workpiece (not shown) to be sprayed as a consequence of electrostatic forces.

Figure 2:
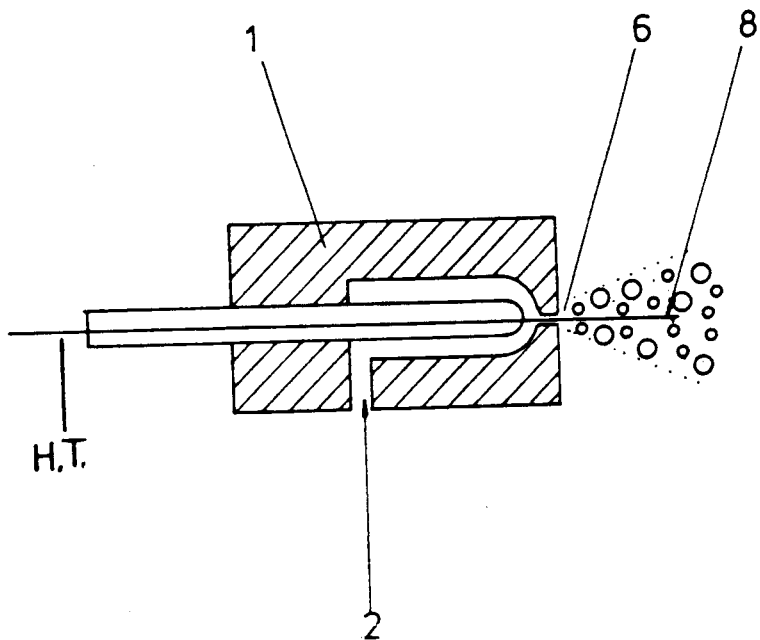
FIG. 2 is a schematic section through a conventional airless electrostatic spray apparatus.

In FIG. 2, the head 1 does not include an inlet for compressed air. In this case, the liquid is introduced into inlet 2 under high pressure and the outlet 6 is small. The release of the liquid under pressure through the outlet 6 causes the liquid to be disrupted into drops. The liquid drops are then given an electrostatic charge by the needle 8 and are attracted to the workpiece as a consequence of electrostatic forces.

Figure 3:
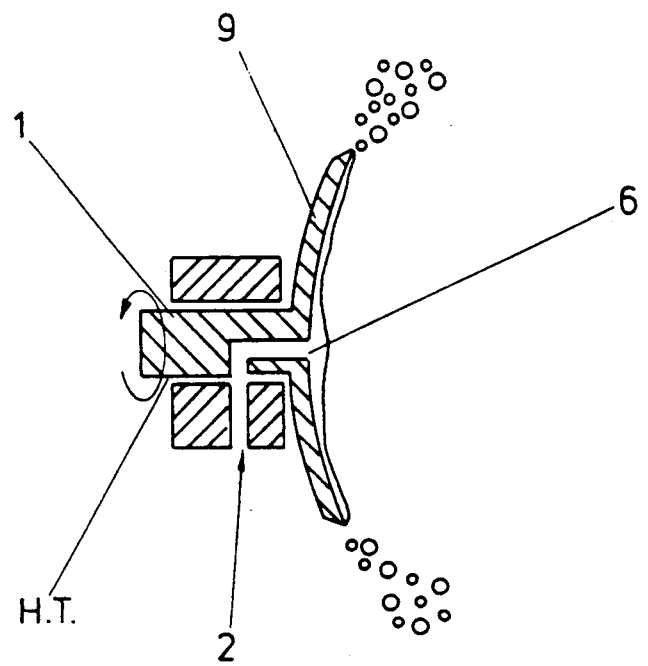
FIG. 3 is a schematic section through a conventional electrostatic rotary bell atomiser.

In accordance with FIG. 3, the head 1 again includes no inlet for compressed air. In this case, however, it is rotatably mounted and the liquid outlet 6 is located at the center of a bell 9. The head 1 is connected to a high tension source and is rotated at high speed (e.g. 30000 RPM) whilst liquid is introduced at inlet 2. The liquid flows towards the edge of the bell 9 and is subjected to high shear as a consequence of the centrifugal force. This causes the liquid to be disrupted into drops which become electrostatically charged by contact with the charged bell 9 and the charged drops are then attracted to the workpiece by electrostatic forces.

Figure 4:
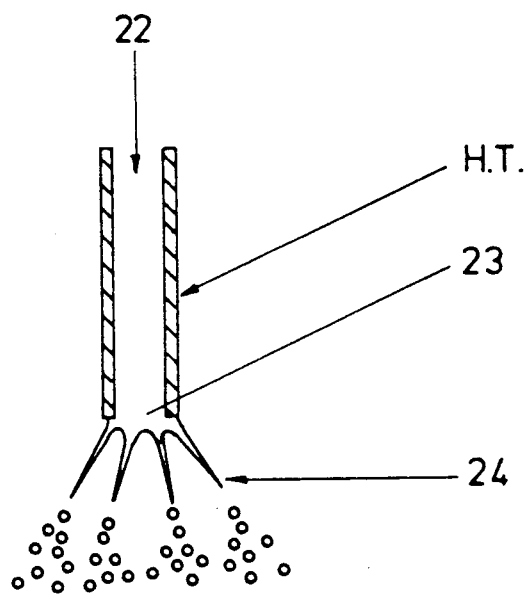
FIG. 4 is a schematic section through a first apparatus suitable for use in carrying out the method of the present invention.

Referring now to FIG. 4, the apparatus comprises a single tube 21 having an inlet 22 for liquid to be sprayed. The tube 21 is connected to a source of high tension. In use, the liquid passes down the tube and forms a plurality of ligaments 24 located around the periphery of the outlet 23 as a consequence of the potential applied to the tube 21. These ligaments then disrupt, under the influence of the potential difference, to form a cloud of charged drops of substantially similar size which are then attracted to the workpiece (not shown) by electrostatic forces.

Figure 5:
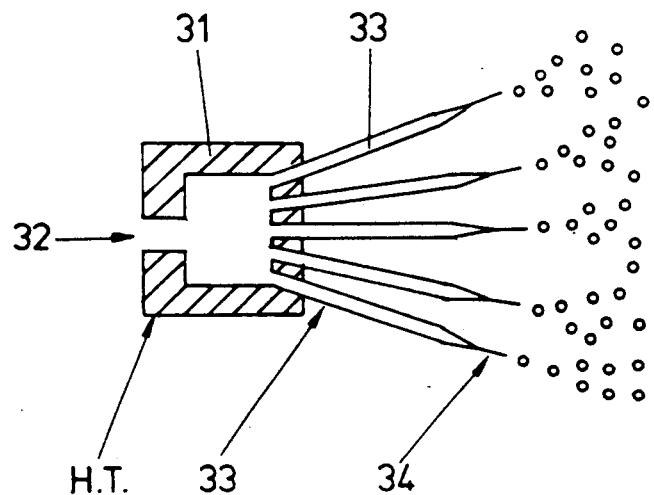
FIG. 5 is a schematic section through a second apparatus suitable for use in carrying out the method of the present invention.

The apparatus of FIG. 5 comprises a head 31 including an inlet 32 for liquid and a plurality of outlet tubes in the form of capillary needles 33. The head 31 is connected to a source of high tension and liquid is introduced via inlet 32. The potential causes the liquid passing down the needles 33 to form ligaments 34, one at the end of each needle, which are then disrupted to form a cloud of substantially uniformly sized charged drops which are attracted to the workpiece.

Figure 6:
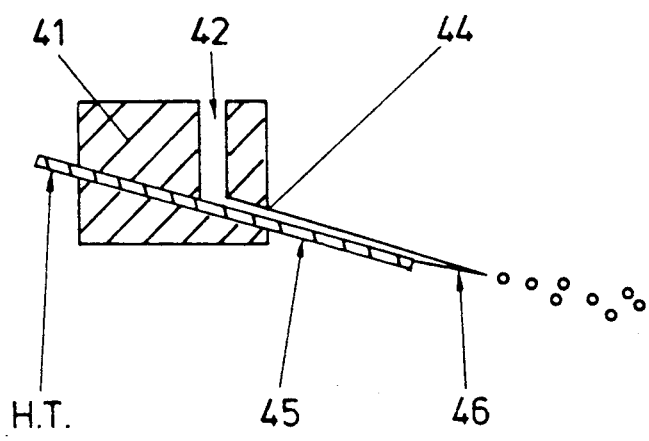
FIG. 6 is a schematic section through a third apparatus suitable for use in carrying out the method of the present invention.

Referring to FIG. 6, the apparatus comprises a head 41 including an inlet 42 for liquid. The inlet 42 communicates with a conduit 43 which terminates in an outlet 44 bounded by a blade 45 connected to a source of high tension.

In use, the liquid introduced into the head 41 flows out of outlet 44 and along blade 45. The potential applied to the blade causes the liquid to form a plurality of ligaments 46 at intervals along the blade edge. These ligaments 46 are subsequently disrupted by the potential to form a cloud of charged drops of substantially uniform size which are then attracted to the workpiece.

It will be apparent, from the foregoing, that whereas conventional electrostatic spraying relies on some mechanical force to atomise the liquid into drops and merely uses electrostatic forces to attract the drops to the workpiece, the method of the present invention requires electrostatic forces to atomise the liquid into drops as well as to attract the drops to the workpiece. In this way a substantially uniform drop size is obtained.

The following Examples illustrate the invention:

EXAMPLE 1

A radiation sensitive plate was prepared by coating an aluminium substrate with a radiation sensitive composition comprising a naphthoquinone diazide ester and a cresol novolak resin.

An electrostatic atomising apparatus (as schematically shown in FIG. 4) including a capillary tube having an external diameter of 3.9 mm and an internal diameter of 2.0 mm was provided and the plate was positioned so that the radiation sensitive layer was beneath the tube. A potential of $-26$ kV was applied to the tube (with respect to the plate substrate) and the tube was fed with a solution consisting of 3.5% naphthoquinone diazide ester, 31.5% cresol novolak resin and 65% 2-ethoxy ethanol acetate. The solution had a conductivity of $1.2 \times 10^7$ pSm$^{-1}$. The ambient temperature was 35 deg C. and the distance between the tip of the tube and the plate was 300 mm. The total flow rate was 0.75 cc per min and 6 ligaments were formed at the end of the tube.

On examination, the treated plate was found to have a discontinuous overlayer made up of radiation sensitive particles having a diameter of between 30 and 40 microns none of which had penetrated the radiation sensitive layer. Also, the increase in weight of the plate due to the overlayer was measured and found to be substantially equal to the weight of material used and no dust was deposited.

When placed in a vacuum exposure frame, the drawdown time was found to be half that of an untreated plate.

In comparison, a further plate was sprayed with an identical solution using an air atomised spray gun. The flow rate was 8 cc per min, the atomising air pressure was 35 psi, the ambient temperature was 35 deg C. and the distance from the spray gun to the plate was 300 mm.

Whilst the drawdown time was again half that of an untreated plate and there was no evidence of penetration of the radiation sensitive layer, it was found that the diameter of the particles was between 30 and 140 microns and only 20% of the material solids sprayed was present on the plate. The remainder of the material was distributed as a fine dust.

A similar comparison was carried out except that the evaporation rate was decreased by using an ambient temperature of 20 deg C. and reducing the distance between the gun and the plate to 200 mm.

The drawdown time was found to be satisfactory and 80% of the material solids sprayed was deposited on the plate. However, the diameter of the particles was between 15 and 200 microns and the larger particles were found to have penetrated the radiation sensitive layer.

Figure 1:
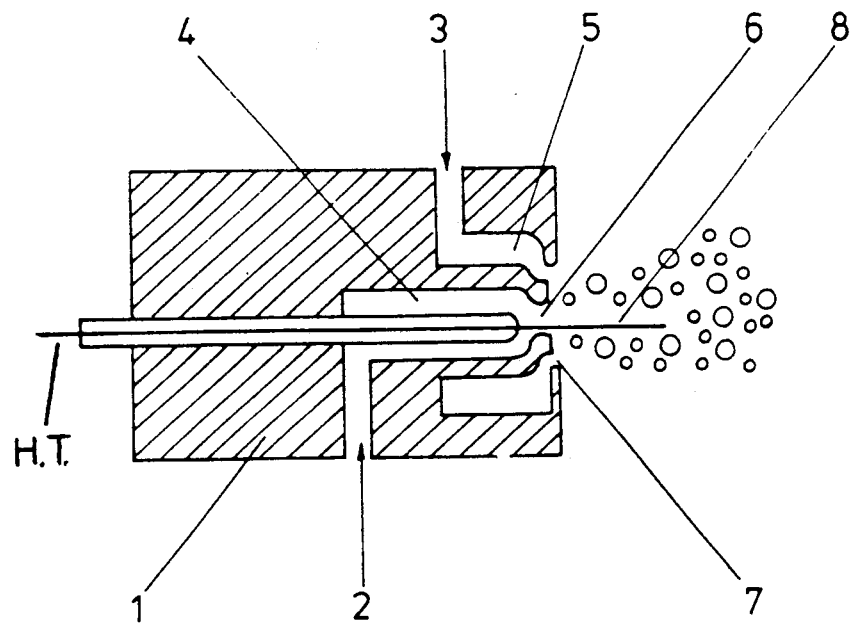
FIG. 1 is a schematic section through a conventional air assisted electrostatic spray apparatus.

As a further comparison more plates were sprayed with an identical solution. However, the spray system used was an air atomised electrostatic spray gun of the type schematically shown in FIG. 1. The spray gun conditions were: liquid feed rate 8 cc/min, atomising pressure 25 psi and voltage $-35$ kV. Plates were produced at ambient temperatures of 20° and 35° C. In both cases the drawdown time was half that of an untreated plate and the increase in weight of the plate due to the overlayer was substantially similar to the weight of the material solids sprayed.

The plate produced at 20° C. had particles of diameter of 15 to 170 microns and the largest particles had penetrated the radiation sensitive layer.

The plate produced at 35° C. had particles of diameter of 30 to 110 microns and the remainder of the material was loosely adhered to the plate surface electrostatically as a fine dust. This dust subsequently transferred onto films and exposure frames during the processing of the plates causing unacceptable dirt problems.

EXAMPLE 2

90 parts of maleic anhydride esterified copolymer of styrene and allyl alcohol (acid value 20); 30 parts of a diazo compound derived from the product obtained by reacting 4-(N-ethyl-N-hydroxyethylamino) acetanilide and diphenylmethane 4,4′-diisocyanate with mesitylene sulphonate as the anion in the manner described in EP-B-0 030 862; and 4.3 parts of Victoria Pure Blue FGA were dissolved in 4200 parts by weight of ethylene glycol monomethyl ether. The resultant solution was coated on to an electrochemically grained and anodised aluminium sheet and dried to form a radiation sensitive plate. An electrostatic atomising apparatus of the type shown schematically in FIG. 5 was provided including 5 capillary needles connected to a manifold with each needle having an internal diameter of 1.7 mm. The radiation sensitive plate was positioned so that its radiation sensitive layer was beneath the needles. A potential of $+30$ kV was applied to the needles (with respect to the aluminium sheet) and the needles were fed with a solution consisting of 9% National 28-2965 and 91% methyl iso butyl ketone and having a conductivity of $8.5 \times 10^6$ pSm$^{-1}$. National 28-2965 is a vinylacetate vinyl versatate half ester maleate supplied by National Adhesives & Resins Ltd. The flow through each needle was 0.225 cc/min and the ambient temperature was 20° C.

On examination, the treated plate was found to have a discontinuous overlayer made up of particles having a diameter between 50 and 80 microns. The increase in weight of the plate due to the overlayer was found to be substantially equal to the weight of the solids content of the solution sprayed.

EXAMPLE 3

30 parts of a poly(vinyl butyral) resin (Butvar B98 manufactured by Monsanto) modified by reaction with 4-toluene sulphonyl isocyanate (acid value 70); 60 parts of a diazo compound derived from the product obtained by reacting 4(N-ethyl-N-hydroxyethylamino) acetanilide and isophorone diisocyanate with 2-hydroxy-4-methoxybenzophenone-5-sulphonate as the anion in the manner described in EP-B-0 030 862; and 7.0 parts of Waxoline Red O were dissolved in 3500 parts by weight of ethylene glycol monomethyl ether. The resultant solution was coated on to an electrochemically grained and anodised aluminium sheet and dried with warm air to form a radiation-sensitive plate. An electrostatic atomising apparatus (schematically shown in FIG. 6) comprising a metal blade was provided and the radiation sensitive plate was positioned so that its radiation sensitive layer was beneath the blade. A potential of $-17$ kV (with respect to the aluminium sheet) was applied to the blade and a thin film of liquid was passed over the blade. The liquid consisted of 25% National 28-2930 and 75% ethyl 3-ethoxypropionate having a conductivity of $0.9 \times 10^5$ pSm$^{-1}$. National 28-2930 is an acrylic terpolymer derived from vinyl acetate, vinyl versatate and crotonic acid and having an acid value of 1.16 Me/g. It is supplied by National Adhesives & Resins Ltd. The flow rate was 0.125 cc/min per cm of blade and the ambient temperature was 35° C. Ligaments were formed every 6 mm along the blade edge.

On examination, the treated plate had a discontinuous overlayer made up of particles having a diameter of 140 to 170 microns in diameter. The increase in weight of the plate due to the overlayer was found to be substantially equal to the weight of solid material sprayed.

EXAMPLE 4

30 parts of an acrylic resin (Macrynal SN510 manufactured by Resinous Chemicals, Ltd); 60 parts of a diazo compound derived from the product obtained by reacting 4(N-ethyl-N-hydroxyethylamino) acetanilide and isophorone diisocyanate with 2-hydroxy-4-methoxybenzophenone-5-sulphonate as the anion in the manner described in EP-B-0 030 862; and 3.5 parts of Victoria Pure Blue FGA were dissolved in 3500 parts by weight of ethylene glycol monomethyl ether. The resultant solution was coated on to an electrochemically grained and anodised aluminium sheet and dried with warm air to form a radiation sensitive plate. The radiation sensitive plate was then located so that its radiation sensitive layer was beneath the electrostatic atomising apparatus described in Example 2. A potential of $+23$ kV was applied to the capillary needles (with respect to the aluminium sheet) and the needles were fed with a coating solution consisting of 25% National 282930, 37.5% ethyl 3-ethoxypropionate and 37.5% acetone. The solution had a conductivity of $0.6 \times 10^7$ pSm$^{-1}$ and the flow through each needle was 0.15 cc/min. The ambient temperature was 20° C.

On examination the treated plate was found to have a discontinuous overlayer made up of particles having a diameter between 80 and 95 microns. The increase in weight due to the overlayer was found to be substantially equal to the weight of solid material sprayed.

We claim:

1. A method of producing a radiation sensitive device which comprises
   (i) providing a substrate carrying a radiation sensitive layer and
   (ii) applying to the surface of the radiation sensitive layer a discontinuous covering layer of material by dissolving the material in a solvent to produce a liquid having a conductivity of from $10^3$ to $10^9$ pSm$^1$ and directing said liquid towards the radiation sensitive layer whilst applying or inducing in said liquid a potential of at least 5 kV relative to the substrate so that the liquid forms one or more ligaments which disrupt into drops which are deposited on the radiation sensitive layer, said potential being the sole disruptive force acting on said liquid.

2. A method according to claim 1 wherein the potential is from 5 to 35 kV.

3. A method according to claim 1 wherein the liquid is directed towards the radiation sensitive layer by being passed through one or more tubes.

4. A method according to claim 1 wherein the liquid is directed towards the radiation sensitive layer by being passed over a blade.

5. A method according to claim 1 wherein the flow rate is from 0.05 to 2.00 cc per min per ligament.

6. A method according to claim 1 wherein said material is a radiation sensitive material.

7. A method according to claim 6 wherein said radiation sensitive material is a quinone diazide.

8. A method according to claim 1 wherein said material is a resin.

* * * * *